(12) United States Patent
Brown et al.

(10) Patent No.: US 7,927,963 B2
(45) Date of Patent: Apr. 19, 2011

(54) INTEGRATED CIRCUIT STRUCTURE, DESIGN STRUCTURE, AND METHOD HAVING IMPROVED ISOLATION AND HARMONICS

(75) Inventors: Brennan J. Brown, Burlington, VT (US); James R. Elliott, Huntington, VT (US); Alvin J. Joseph, Williston, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 229 days.

(21) Appl. No.: 12/187,415

(22) Filed: Aug. 7, 2008

(65) Prior Publication Data

US 2010/0035403 A1 Feb. 11, 2010

(51) Int. Cl.
*H01L 21/76* (2006.01)
(52) U.S. Cl. .......................... 438/422; 257/510
(58) Field of Classification Search .................. 438/422; 257/510, 221, E21.546, E21.55, 424, 438
See application file for complete search history.

(56) References Cited

U.S. PATENT DOCUMENTS

| | | | |
|---|---|---|---|
| 4,731,594 A | 3/1988 | Kumar | |
| 4,958,898 A | 9/1990 | Friedman et al. | |
| 5,057,450 A | 10/1991 | Bronner et al. | |
| 5,155,061 A | 10/1992 | O'Connor et al. | |
| 5,883,009 A | 3/1999 | Villa et al. | |
| 6,057,214 A | 5/2000 | Joyner | |
| 6,097,076 A * | 8/2000 | Gonzalez et al. | 257/513 |
| 6,110,769 A | 8/2000 | Son | |
| 6,214,657 B1 | 4/2001 | Lee | |
| 6,277,703 B1 | 8/2001 | Barlocchi et al. | |
| 6,281,555 B1 | 8/2001 | Yu et al. | |
| 6,320,476 B1 | 11/2001 | Tsukahara | |
| 6,444,534 B1 | 9/2002 | Maszara | |

(Continued)

FOREIGN PATENT DOCUMENTS

| JP | 03-204225 | 9/1991 |
|---|---|---|
| JP | 2000-294568 | 10/2000 |

OTHER PUBLICATIONS

Brown et al., U.S. Appl. No. 12/187,419, Office Action Communication, Feb. 22, 2010, 11 pages.

(Continued)

*Primary Examiner* — David Vu
*Assistant Examiner* — Shaun Campbell
(74) *Attorney, Agent, or Firm* — Gibb I.P. Law Firm, LLC; Richard M. Kotulak, Esq.

(57) ABSTRACT

Disclosed are embodiments of a semiconductor structure, a design structure for the semiconductor structure and a method of forming the semiconductor structure. The embodiments reduce harmonics and improve isolation between the active semiconductor layer and the substrate of a semiconductor-on-insulator (SOI) wafer. Specifically, the embodiments incorporate a trench isolation region extending to a fully or partially amorphized region of the wafer substrate. The trench isolation region is positioned outside lateral boundaries of at least one integrated circuit device located at or above the active semiconductor layer of the SOI wafer and, thereby improves isolation. The fully or partially amorphized region of the substrate reduces substrate mobility, which reduces the charge layer at the substrate/BOX interface and, thereby reduces harmonics. Optionally, the embodiments can incorporate an air gap between the wafer substrate and integrated circuit device(s) in order to further improve isolation.

7 Claims, 12 Drawing Sheets

U.S. PATENT DOCUMENTS

| | | |
|---|---|---|
| 6,570,217 B1 | 5/2003 | Sato et al. |
| 6,800,518 B2 | 10/2004 | Bendernagel et al. |
| 6,946,373 B2 | 9/2005 | Agnello et al. |
| 6,972,215 B2 | 12/2005 | Sakaguchi et al. |
| 6,992,938 B1 | 1/2006 | Shubat et al. |
| 7,135,372 B2 | 11/2006 | Huang et al. |
| 7,202,123 B1 | 4/2007 | Pan |
| 7,268,065 B2 | 9/2007 | Lin et al. |
| 2002/0070417 A1 | 6/2002 | Kimura et al. |
| 2007/0178713 A1 | 8/2007 | Jeng et al. |
| 2007/0216501 A1 | 9/2007 | Tsai et al. |
| 2007/0262422 A1 | 11/2007 | Bakalski et al. |
| 2009/0160009 A1* | 6/2009 | Dietz et al. .......... 257/506 |

OTHER PUBLICATIONS

Bastida, et al., "Air Bridge FET Devices for High-Performance Microwave Circuits," pp. 239-244.

Brown et al., U.S. Appl. No. 12/187,419, Notice of Allowance, Aug. 23, 2010, 4 pages.

\* cited by examiner

INTEGRATED CIRCUIT STRUCTURE, DESIGN STRUCTURE, AND METHOD HAVING IMPROVED ISOLATION AND HARMONICS

CROSS-REFERENCE TO RELATED APPLICATIONS

This application is related to the following co-pending application filed concurrently herewith by the same Applicants and assigned to the same Assignee, namely, International Business Machines Corporation (IBM Corporation): "INTEGRATED CIRCUIT STRUCTURE, DESIGN STRUCTURE, AND METHOD HAVING IMPROVED ISOLATION AND HARMONICS", Ser. No. 12/187,419. The complete disclosure of this related co-pending application is incorporated herein by reference.

BACKGROUND OF THE INVENTION

The embodiments of the invention generally relate to integrated circuit structures and, more specifically, to an integrated circuit structure, a design structure for the integrated circuit structure and a method of forming the integrated circuit structure with improved isolation and, in the case of a radio frequency (RF) device (e.g., a RF switch) with reduced harmonics.

Integrated circuit devices formed in or above the active semiconductor layer (e.g., the active silicon layer) of a semiconductor-on-insulator (SOI) wafer often suffer from performance degradation due to coupling capacitance between the integrated circuit devices and the wafer substrate (e.g., a silicon substrate). Some integrated circuit devices, such as radio frequency (RF) switches, further suffer due to harmonics resulting from the resulting charge layer at the interface between the SOI insulator layer (e.g., the buried oxide (BOX) layer) and the wafer substrate. Therefore, there is a need in the art for a semiconductor structure that is formed using an SOI wafer and that has reduced harmonics and improved isolation between the active semiconductor layer and the wafer substrate.

BRIEF SUMMARY OF THE INVENTION

In view of the foregoing disclosed herein are embodiments of a semiconductor structure, a design structure for the semiconductor structure and a method of forming the semiconductor structure. The embodiments reduce harmonics and improve isolation between the active semiconductor layer and the substrate of a semiconductor-on-insulator (SOI) wafer. Specifically, the embodiments incorporate a deep trench isolation region extending to a fully or partially amorphized region of the SOI wafer substrate located either at the top surface of the substrate or embedded within the substrate. The deep trench isolation region is positioned outside lateral boundaries of at least one integrated circuit device located at or above the active semiconductor layer of the SOI wafer and, thereby improves isolation. The fully or partially amorphized region of the substrate reduces substrate mobility, which reduces the charge layer at the substrate/BOX interface and, thereby reduces harmonics. Optionally, the embodiments can further incorporate an air gap between the wafer substrate and integrated circuit device(s) in order to further improve isolation.

More particularly, in one embodiment, the semiconductor structure of the present invention comprises a semiconductor-on-insulator (SOI) wafer. This SOI wafer can comprise a semiconductor substrate, an insulating layer (e.g., a buried oxide layer) on the semiconductor substrate, a semiconductor layer on the insulating layer and a shallow trench isolation region within said semiconductor layer on said insulating layer. The semiconductor substrate can comprise a single crystalline semiconductor material and can further comprise an at least partially amorphized region (e.g., an inert ion implant region). The at least partially amorphized region being located either at the top surface of or embedded within the single crystalline semiconductor material. Additionally, the semiconductor structure can comprise a deep trench isolation region extending through the shallow trench isolation region and the insulating layer. This deep trench isolation region can have a bottom surface that is adjacent to the at least partially amorphized region of semiconductor substrate.

Another embodiment of the semiconductor structure of the present invention can similarly comprise a semiconductor-on-insulator (SOI) wafer. This SOI wafer can comprise a semiconductor substrate, an insulating layer on the semiconductor substrate and a semiconductor layer on the insulating layer. The semiconductor substrate can comprise a single crystalline semiconductor material and can further comprise an at least partially amorphized region (e.g., an inert ion implant region). The at least partially amorphized region being located either at the top surface of or embedded within the single crystalline semiconductor material. A first deep trench isolation region can extend through said semiconductor layer to the substrate. This first deep trench isolation region can border a portion of the insulating layer comprising an air gap. A second deep trench isolation region can extend through an opening in the semiconductor and further through the air gap. This second deep trench isolation region can have a bottom surface that is adjacent to the at least partially amorphized region of the semiconductor substrate, be it embedded within or at the top surface of the semiconductor substrate.

Also disclosed herein are embodiments of a design structure for the above-mentioned semiconductor structure embodiments. The design structure embodiments can each be embodied in a machine readable medium used in a design process, can reside on storage medium as a data format used for the exchange of layout data of integrated circuits. Furthermore, the design structure embodiments can each comprise a netlist and can include test data, characterization data, verification data, and/or design specifications.

Also disclosed herein are method embodiments for forming the above-described semiconductor structure. Specifically, one method embodiment comprises providing a semiconductor-on-insulator (SOI) wafer. This SOI wafer can comprise a semiconductor substrate made of a single crystalline semiconductor material, an insulating layer on the semiconductor substrate, a semiconductor layer on the insulating layer, and a shallow trench isolation region within the semiconductor layer on the insulating layer. Next, this method embodiment can comprise etching a trench extending through the shallow trench isolation region and the insulating layer and stopping at the top surface of the semiconductor substrate. Once the trench is etched, inert ions can be implanted into the semiconductor substrate so as to form an at least partially amorphized region of the semiconductor substrate adjacent to a bottom surface of the trench. Since the bottom surface of the trench is at the top surface of the substrate, the at least partially amorphized region of the semiconductor substrate is immediately adjacent to the insulating layer. After the trench is etched, it can be filled with a dielectric material so as to form a deep trench isolation region.

Another embodiment of the method similarly comprises providing a semiconductor-on-insulator (SOI) wafer. This SOI wafer can comprise a semiconductor substrate made of a single crystalline semiconductor material, an insulating layer on the semiconductor substrate, a semiconductor layer on the insulating layer, and a shallow trench isolation region within the semiconductor layer on the insulating layer. Next, this method embodiment can comprise etching a trench extending through the shallow trench isolation region and the insulating layer and stopping a predetermined depth within the semiconductor substrate (i.e., below the top surface of the semiconductor substrate). Once the trench is etched, inert ions can be implanted into the semiconductor substrate so as to form an at least partially amorphized region of the semiconductor substrate adjacent to a bottom surface of the trench. Since the bottom surface of the trench is below the top surface of the substrate, the at least partially amorphized region of the semiconductor substrate is embedded within the substrate and, thereby separated from the insulating layer. After the trench is etched, it can be filled with a dielectric material so as to form a deep trench isolation region.

Yet another embodiment of the method similarly comprises providing a semiconductor-on-insulator (SOI) wafer. This SOI wafer can comprise a semiconductor substrate made of a single crystalline semiconductor material, an insulating layer on the semiconductor substrate and a semiconductor layer on the insulating layer. This embodiment further comprises forming a shallow trench isolation region within the semiconductor layer and further forming a first deep trench isolation region extending through the semiconductor layer and the insulator layer to the semiconductor substrate. The shallow trench isolation region and the first deep trench isolation region are formed such they are separated by semiconductor material. They are further formed such that the first deep trench isolation region comprises a different material than both the insulating layer and the shallow trench isolation region. For example, the insulating layer and shallow trench isolation region can comprise an oxide and the first deep trench isolation region can comprise a nitride or polysilicon material. Forming of these trench isolation regions and particularly the shallow trench isolation region defines an integrated circuit device area of the wafer.

Next, this method comprises etching a trench so that it extends through the shallow trench isolation region and the insulating layer and stops either at top surface of the semiconductor substrate (e.g., as in the first method embodiment, described above) or at a predetermined depth within the semiconductor substrate (e.g., as in the second method embodiment described above).

Once the trench is etched, inert ions are implanted into the semiconductor substrate so as to form an at least partially amorphized region of the semiconductor substrate adjacent to the bottom surface of the trench.

Then, after the trench is etched and after the ions are implanted, an isotropic etch process is performed to selectively remove that portion of the insulating layer surrounded by the first deep trench isolation region so as to create an air gap in the insulating layer between the semiconductor layer and the semiconductor substrate. This isotropic etch process will further remove the shallow trench isolation region that defines the integrated circuit device area of the wafer, thereby creating an opening within the semiconductor layer that extends to the air gap.

It should be noted that the previously-described process of forming a shallow trench isolation region should be performed so as to leave at least one section of the semiconductor layer within the integrated circuit device area of the wafer intact (i.e., connected to the first deep trench isolation region) for mechanical stability. This will prevent collapse, during air gap formation, of the semiconductor layer within the integrated circuit device area of the wafer. Once the air gap is formed, a dielectric material can be deposited so as to form a second deep trench isolation region.

BRIEF DESCRIPTION OF THE SEVERAL VIEWS OF THE DRAWINGS

The embodiments of the invention will be better understood from the following detailed description with reference to the drawings, which are not necessarily drawing to scale and in which.

DETAILED DESCRIPTION OF THE INVENTION

Figure 1:
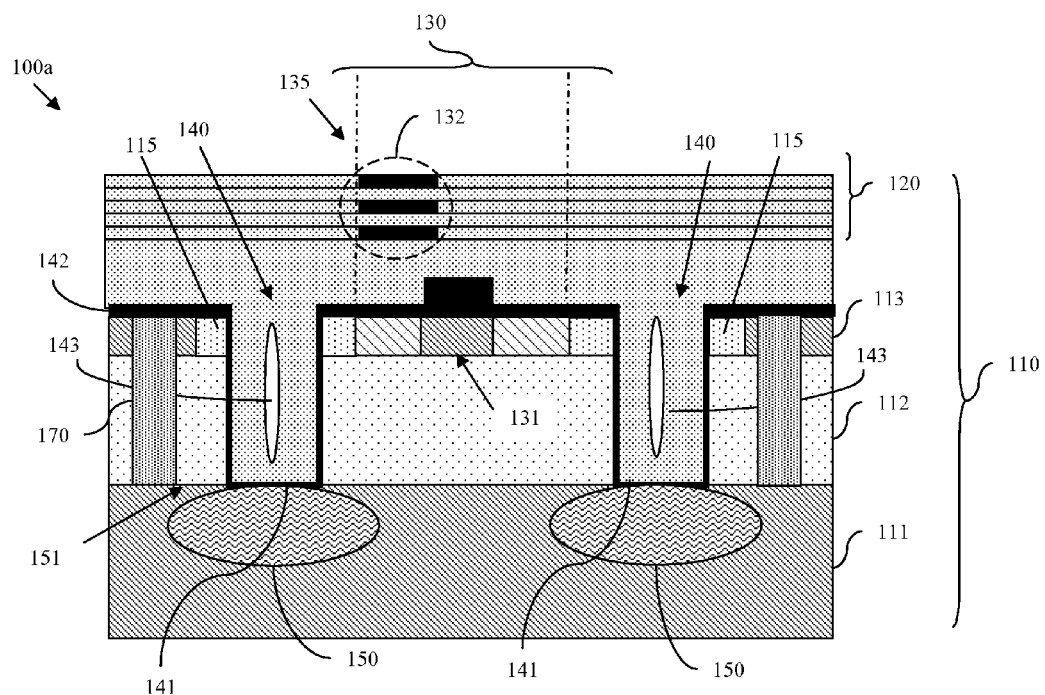
FIG. 1 is a cross-section diagram illustrating an embodiment of the semiconductor structure of the present invention.

The embodiments of the invention and the various features and advantageous details thereof are explained more fully with reference to the non-limiting embodiments that are illustrated in the accompanying drawings and detailed in the following description.

As mentioned above, integrated circuit devices formed in or above the active semiconductor layer (e.g., the active silicon layer) of a semiconductor-on-insulator (SOI) wafer often suffer from performance degradation due to coupling capacitance between the integrated circuit devices and the wafer substrate (e.g., a silicon substrate). Some integrated circuit devices, such as radio frequency (RF) switches, further suffer due to harmonics resulting from the resulting charge layer at the interface between the SOI insulator layer (e.g., the buried oxide (BOX) layer) and the wafer substrate. Therefore, there is a need in the art for a semiconductor structure that is formed using an SOI wafer and that has reduced harmonics and improved isolation between the active semiconductor layer and the wafer substrate.

In view of the foregoing disclosed herein are embodiments of a semiconductor structure, a design structure for the semiconductor structure and a method of forming the semiconductor structure. The embodiments reduce harmonics and improve isolation between the active semiconductor layer and the substrate of a semiconductor-on-insulator (SOI) wafer. Specifically, the embodiments incorporate a deep trench isolation region extending to a fully or partially amorphized region of the SOI wafer substrate located either at the top surface of the substrate or embedded within the substrate. The deep trench isolation region is positioned outside lateral boundaries of at least one integrated circuit device located at or above the active semiconductor layer of the SOI wafer and, thereby improves isolation. The fully or partially amorphized region of the substrate reduces substrate mobility, which reduces the charge layer at the substrate/BOX interface and, thereby reduces harmonics. Optionally, the embodiments can further incorporate an air gap between the wafer substrate and integrated circuit device(s) in order to further improve isolation.

More particularly, in one embodiment, the semiconductor structure 100a (see FIG. 1) and 100b (see FIG. 2) of the present invention comprises a semiconductor-on-insulator (SOI) wafer 110. This SOI wafer 110 can comprise a semiconductor substrate 111, as described in greater detail below. The SOI wafer 110 can further comprise an insulating layer 112 on the semiconductor substrate 111. This insulating layer 112 can, for example, comprise a buried oxide (BOX) layer or some other suitable insulating layer. The SOI wafer 110 can further comprise a semiconductor layer 113 on the insulating layer 112. The semiconductor layer 113 can, for example, comprise a single crystalline semiconductor material layer (e.g., a silicon layer or any other suitable single crystalline semiconductor layer). A shallow trench isolation (STI) region 115 within the semiconductor layer 113 can define (i.e., delimit) an integrated circuit device area 130 of the semiconductor structure 100a, 100b. This STI region 115 can, for example, comprise a trench extending from the top surface of the semiconductor layer 113 down to the insulating layer 112. It can be filled, for example, with an insulating material, such as silicon dioxide ($SiO_2$) and can border the integrated circuit device area 130.

The semiconductor substrate 111 can comprise a single crystalline semiconductor material (e.g., silicon) and can further comprise an at least partially amorphized region 150 (i.e., a partially or fully amorphized region) within the single crystalline semiconductor material. Specifically, the at least partially amorphized region 150 can be located at the top surface 151 of the single crystalline semiconductor material such that it is immediately adjacent to the insulating layer 112 (i.e., at the interface between the insulating layer 112 and the substrate 111) (as illustrated in the structure 100a of FIG. 1). Alternatively, the at least partially amorphized region 150 can be embedded within the single crystalline semiconductor material so that it is separated from the insulating layer 112 by a predetermined distance 260 (as illustrated in the structure 100b of FIG. 2). In either case, the at least partially amorphized region 150 of the semiconductor substrate 111 can, for example, comprise an inert ion implant region that either fully or partially amorphizes the single crystalline substrate material and, thereby increases resistance within the substrate and minimize harmonics. The inert ions can comprise, for example, argon ions, krypton ions, nitrogen ions, xenon ions, neon ions, carbon ions, oxygen ions, etc.

Additionally, the semiconductor structure 100a, 100b can comprise a first deep trench isolation region 170. This first deep trench isolation region 170 can isolate the integrated circuit device area 130 from other regions of the SOI wafer. This first deep trench isolation region 170 can be filled with a material different than the insulating layer 112 and also different from the STI region 115. For example, the first deep trench isolation region can be filled with a nitride or polysilicon fill material.

Wiring layers 120 can be positioned above the semiconductor layer 113. Furthermore, at least one integrated circuit device can be located within the designated integrated circuit area 130 and, more particularly, in the semiconductor layer 113 (e.g., see radio frequency switch 131 comprising doped semiconductor regions (as shown) of the semiconductor layer 113) and/or within one or more of the wiring layers 120 (e.g., see inductor 132).

The semiconductor structure 100a, 100b can further comprise a second deep trench isolation region 140 extending through the shallow trench isolation region 115 and the insulating layer 112 to the semiconductor substrate 111. This second deep trench isolation region 140 can have a bottom surface 141 that is adjacent to the at least partially amorphized region 150 of semiconductor substrate 111, whether the at least partially amorphized region 150 is at the top surface of the substrate 111 as in FIG. 1 or embedded within the substrate 111 as in FIG. 2. This second deep trench isolation region 140 can further be filled, for example, with borophosphosilicate glass (BPSG) 143 and, optionally, lined with a conformal oxide or nitride layer 142 (e.g., silicon dioxide ($SiO2$) or silicon nitride (SiN)). It should be noted that the deposition techniques (e.g., low pressure chemical vapor deposition (LPCVD) or plasma enhanced chemical vapor deposition (PECVD)) used to fill the second deep trench isolation region 140 with BPSG may result in voids (as illustrated). Alternatively, the second deep trench isolation region 140 can be filled with any other suitable trench isolation fill material (e.g., an oxide or nitride fill material).

The second deep trench isolation region 140 landing on the at least partially amorphized region 150 of the substrate 111 can specifically be positioned outside the lateral boundaries 135 of the integrated circuit device area 130 and particularly outside the lateral boundaries of the at least one integrated circuit device 131, 132, whether that device is within the semiconductor layer 113 or in the wiring layers 120. An integrated circuit device, such as a radio frequency (RF) switch 131 in the semiconductor layer 113, an inductor 132 in the wiring layers 120 or any other integrated circuit device, which may suffer performance degradation due to coupling capacitance with the wafer substrate 111 and/or due to harmonics, will benefit from the isolation provided by the second deep trench isolation region 140 and insulating layer 112 and, if applicable, from the reduced harmonics provided by the fully or partially amorphized region 150 of the substrate 111. It should be understood that although the integrated circuit devices 131, 132 are illustrated as comprising only a single component (e.g., a single transistor or single inductor), it is anticipated that each integrated circuit device within the designated integrated circuit area 130 may contain multiple components (e.g., transistors, inductors, etc.) and, additionally, that multiple integrated circuit devices may be contained with the designated integrate circuit area 130.

Another embodiment of the semiconductor structure 300a (see FIG. 3) and 300b (see FIG. 4) of the present invention further incorporates an air gap 380 (e.g., a selectively removed/etched portion) within the insulating layer 312 between the substrate 311 and semiconductor layer 313 to further increase isolation of the integrated circuit device(s) 331, 332 within the integrated circuit device area 330 of the SOI wafer 310 from the substrate 311.

Specifically, as with the previously described embodiment, in this embodiment, the semiconductor structure 300a, 300b of the present invention comprises a semiconductor-on-insulator (SOI) wafer 310. This SOI wafer 310 can comprise a semiconductor substrate 311, as described in greater detail below. The SOI wafer 310 can further comprise an insulating layer 112 on the semiconductor substrate 311. This insulating layer 312 can, for example, comprise a buried oxide (BOX) layer or some other suitable insulating layer. The SOI wafer 310 can further comprise a semiconductor layer 313 on the insulating layer 312. The semiconductor layer 313 can, for example, comprise a single crystalline semiconductor material layer (e.g., a silicon layer or any other suitable single crystalline semiconductor layer). A patterned opening 316 extending vertically through the semiconductor layer 313 can define (i.e., delimit, border, etc.) an integrated circuit device area 330 of the structure 300a, 300b.

The semiconductor substrate 311 can comprise a single crystalline semiconductor material (e.g., silicon) and can further comprise an at least partially amorphized region 350 (i.e., a partially or fully amorphized region) within the single crystalline semiconductor material. Specifically, the at least partially amorphized region 350 can be located at the top surface 351 of the single crystalline semiconductor material such that it is immediately adjacent to the insulating layer 312 (i.e., at the interface between the insulating layer 312 and the substrate 311) (as illustrated in the structure 300a of FIG. 3). Alternatively, the at least partially amorphized region 350 can be embedded within the single crystalline semiconductor material so that it is separated from the insulating layer 312 by a predetermined distance 460 (as illustrated in the structure 300b of FIG. 4). In either case, the at least partially amorphized region 350 of the semiconductor substrate 311 can, for example, comprise an inert ion implant region that either fully or partially amorphizes the single crystalline substrate material and, thereby increases resistance within the substrate 311 and minimize harmonics. The inert ions can comprise, for example, argon ions, krypton ions, nitrogen ions, xenon ions, neon ions, carbon ions, oxygen ions, etc.

Additionally, the semiconductor structure 300a, 300b can comprise a first deep trench isolation region 370 outside the opening 316 and extending through the semiconductor layer 313 and the insulating layer 312 stopping on the substrate 311. This first deep trench isolation region 370 can isolate the integrated circuit device area 330 from other regions of the SOI wafer. This first deep trench isolation region 370 can further be filled with an isolation material that is different from that used for the insulating layer 312 so that during processing a portion of the insulating layer 312 bounded by the first deep trench isolation region 370 can be selectively etched so as to form an air gap 380. For example, this first deep trench isolation region 370 can comprise a nitride or polysilicon fill material. The air gap 380 can separate the semiconductor layer 313 from the substrate 311 within the designated integrated circuit device area 330 of the SOI wafer 310.

The semiconductor structure 300a, 300b can further comprise a second deep trench isolation region 340 extending through the opening 316. The second deep trench isolation region 340 can have a bottom surface 341 that is adjacent to the at least partially amorphized region 350 of semiconductor substrate 311, whether the at least partially amorphized region 350 is at the top surface of the semiconductor substrate 311 as in FIG. 3 or embedded within the semiconductor substrate 311 as in FIG. 4. This second deep trench isolation region 340 is positioned outside the designated integrated circuit area 330 of the SOI wafer 310 and particularly outside the lateral boundaries 335 of at least one integrated circuit device also located within the designated integrated circuit device area 330 (e.g., see devices 331 and 332). This second deep trench isolation region 340 can be filled, for example, with borophosphosilicate glass (BPSG) 343 and, optionally, lined with a conformal oxide or nitride layer 342 (e.g., silicon dioxide (SiO2) or silicon nitride (SiN)). It should be noted that the deposition techniques (e.g., low pressure chemical vapor deposition (LPCVD) or plasma enhanced chemical vapor deposition (PECVD)) used to fill the trench isolation region 340 with BPSG may result in voids (as illustrated). Alternatively, the second trench isolation region 340 can be filled with any other suitable trench isolation fill material (e.g., an oxide or nitride fill material).

Figure 3:
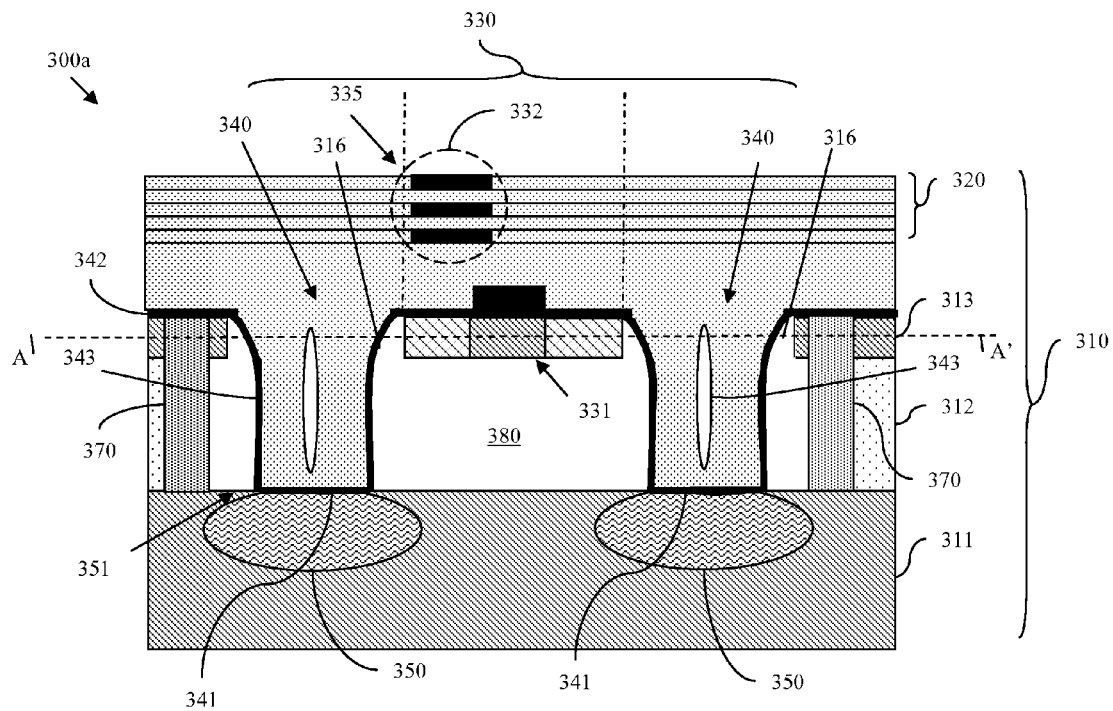
FIG. 3 is a cross-section diagram illustrating another embodiment of the semiconductor structure of the present invention.
Figure 4:
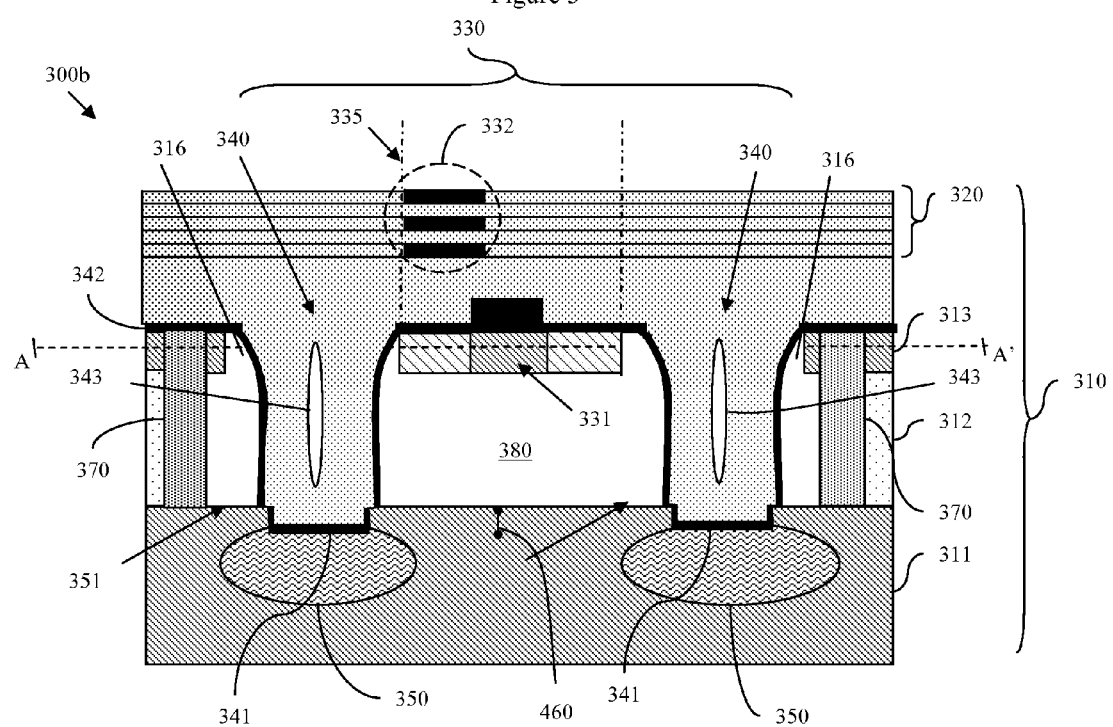
FIG. 4 is a cross-section diagram illustrating an alternative configuration for the embodiment of the semiconductor structure of FIG. 3.
Figure 5:
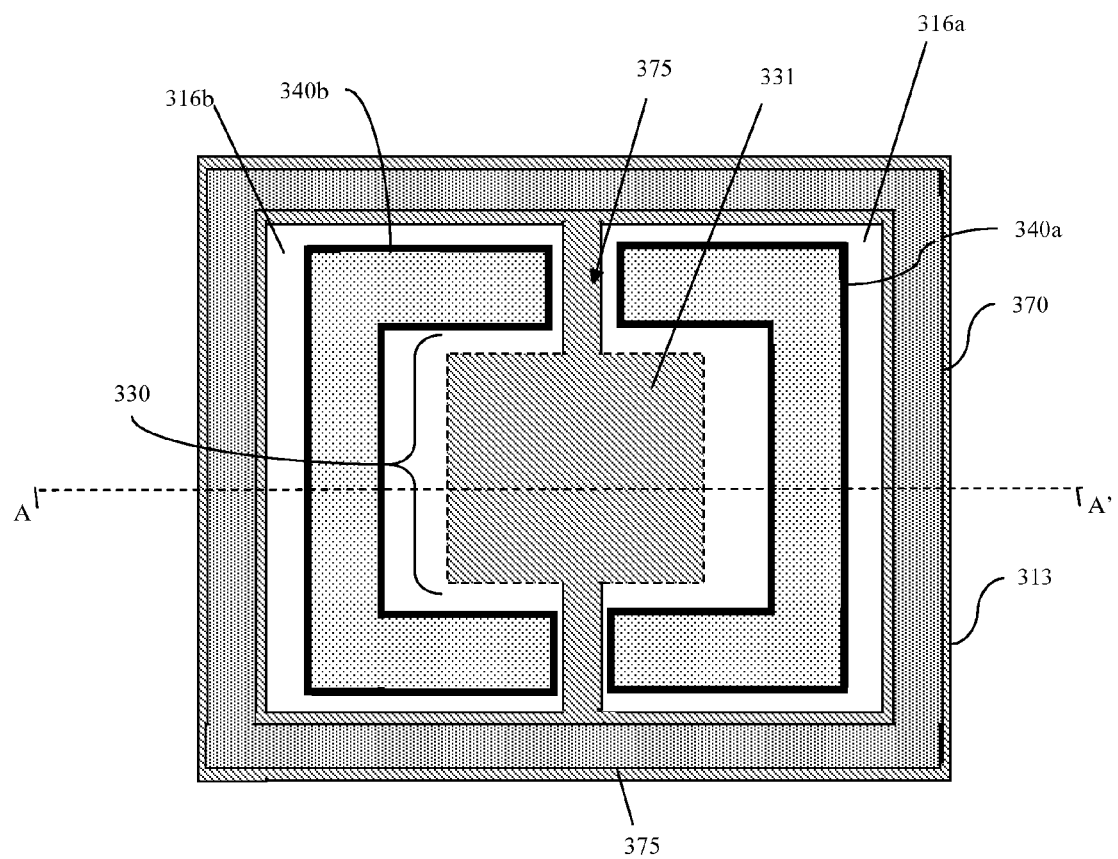
FIG. 5 is a top view diagram of the A-A' cross section at the semiconductor layer level of FIGS. 3 and 4.

FIG. 5 is a top view diagram of the cross-section A-A' through the semiconductor layer 313 of the semiconductor structure 300a, 300b (as designated in FIGS. 3 and 4). It should be noted that, during formation of the structure 300a, 330b, a shallow trench isolation (STI) region is patterned, formed and then removed by an isotropic etch process to form the opening 316 (see detailed discussion in method embodiment below). Specifically, the STI and, thereby, the opening 316 is patterned so that it is segmented into two or more segments (see segments 316a and 316b) so that sections 375 of the semiconductor layer 313 extend across the designated integrated circuit device area 330 and are connected to the first deep trench isolation region 370). These semiconductor layer sections 375 remain intact during air gap 380 formation and function as a bridge for mechanical stability (i.e., in order to prevent collapse of the semiconductor layer 313 into the air gap 380). Consequently, when the second deep trench isolation region 340 is formed extending through the opening 316, it is also formed in segments (see segment 340a and 340b).

Referring again to FIGS. 3 and 4, as with the previously described embodiment, the semiconductor structure 300a, 300b can further comprise wiring layers 320 above the semiconductor layer 313. At least one integrated circuit device can be located in the semiconductor layer 313 (e.g., see radio frequency switch 331) and/or within one or more of the wiring layers 320 (e.g., see inductor 332) within the designated integrated circuit device area 330 of the SOI wafer. The second deep trench isolation region 340 landing on the at least partially amorphized region 350 of the substrate 311 can be positioned outside lateral boundaries 335 of the integrated circuit device area 330 and particularly outside the lateral boundaries of at least one integrated circuit device 331, 332. An integrated circuit device, such as a radio frequency (RF) switch 331 in the semiconductor layer 313, a inductor 332 in the wiring layers 320 or any other integrated circuit device, which may suffer performance degradation due to coupling capacitance with the wafer substrate 311 and/or due to harmonics, will benefit from the isolation provided by the trench isolation region 340 and air gap 380 within the insulating layer 312 and, if applicable, from the reduced harmonics provided by the fully or partially amorphized region 350 of the substrate 311. It should be understood that although the integrated circuit devices 331, 332 are illustrated as comprising only a single component (e.g., a single transistor or single inductor), it is anticipated that each integrated circuit device within the designated integrated circuit area 330 may contain multiple components (e.g., transistors, inductors, etc.) and, additionally, that multiple integrated circuit devices may be contained with the designated integrate circuit area 330.

Figure 6:
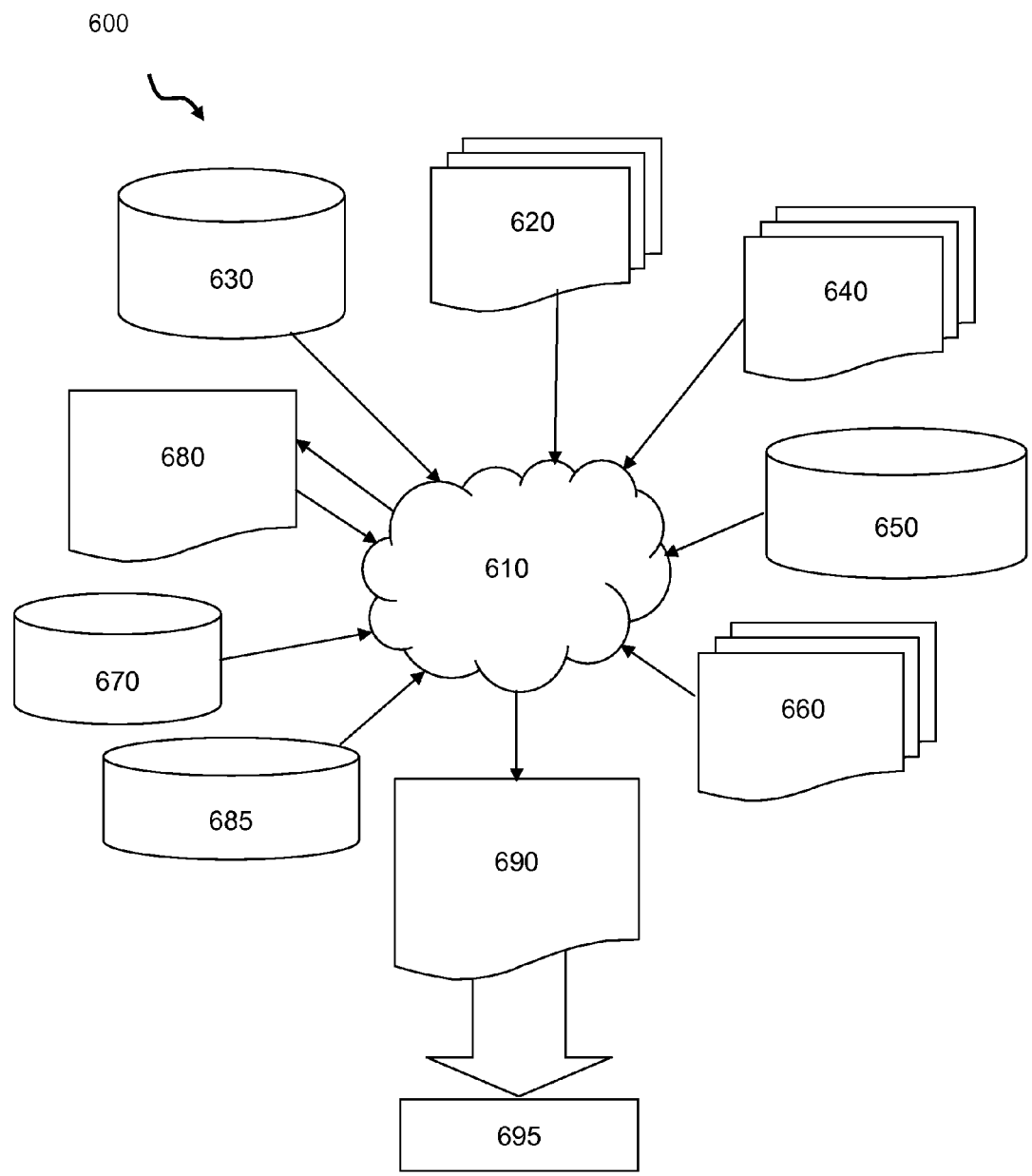
FIG. 6 is a flow diagram of a design process used in semiconductor design, manufacture, and/or test.

Also disclosed herein are embodiments of a design structure for the above-mentioned semiconductor structure embodiments 100a, 100b, 300a and 300b illustrated in FIGS. 1-4. FIG. 6 shows a block diagram of an exemplary design flow 600 used for example, in semiconductor design, manufacturing, and/or test. Design flow 600 may vary depending on the type of IC being designed. For example, a design flow 600 for building an application specific IC (ASIC) may differ from a design flow 600 for designing a standard component. Design structure 620 is preferably an input to a design process 610 and may come from an IP provider, a core developer, or other design company or may be generated by the operator of the design flow, or from other sources. Design structure 620 comprises an embodiment of the invention as shown in FIGS. 1-4 in the form of schematics or HDL, a hardware-description language (e.g., Verilog, VHDL, C, etc.). Design structure 620 may be contained on one or more machine readable medium. For example, design structure 620 may be a text file or a graphical representation of an embodiment of the invention as shown in FIGS. 1-4.

Design process 610 preferably synthesizes (or translates) an embodiment of the invention as shown in FIGS. 1-4 into a netlist 680, where netlist 680 is, for example, a list of wires, transistors, logic gates, control circuits, I/O, models, etc. that describes the connections to other elements and circuits in an integrated circuit design and recorded on at least one of machine readable medium. This may be an iterative process in which netlist 680 is resynthesized one or more times depending on design specifications and parameters for the circuit.

Design process 610 may include using a variety of inputs; for example, inputs from library elements 630 which may house a set of commonly used elements, circuits, and devices, including models, layouts, and symbolic representations, for a given manufacturing technology (e.g., different technology nodes, 32 nm, 45 nm, 90 nm, etc.), design specifications 640, characterization data 650, verification data 660, design rules 670, and test data files 685 (which may include test patterns and other testing information).

Design process 610 may further include, for example, standard circuit design processes such as timing analysis, verification, design rule checking, place and route operations, etc. One of ordinary skill in the art of integrated circuit design can appreciate the extent of possible electronic design automation tools and applications used in design process 610 without deviating from the scope and spirit of the invention. The design structure of the invention is not limited to any specific design flow.

Design process 610 preferably translates an embodiment of the invention as shown in FIGS. 1-4, along with any additional integrated circuit design or data (if applicable), into a second design structure 690. Design structure 690 resides on a storage medium in a data format used for the exchange of layout data of integrated circuits (e.g. information stored in a GDSII (GDS2), GL1, OASIS, or any other suitable format for storing such design structures). Design structure 690 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1-4. Design structure 690 may then proceed to a stage 695 where, for example, design structure 690: proceeds to tape-out, is released to manufacturing, is released to a mask house, is sent to another design house, is sent back to the customer, etc.

Figure 2:
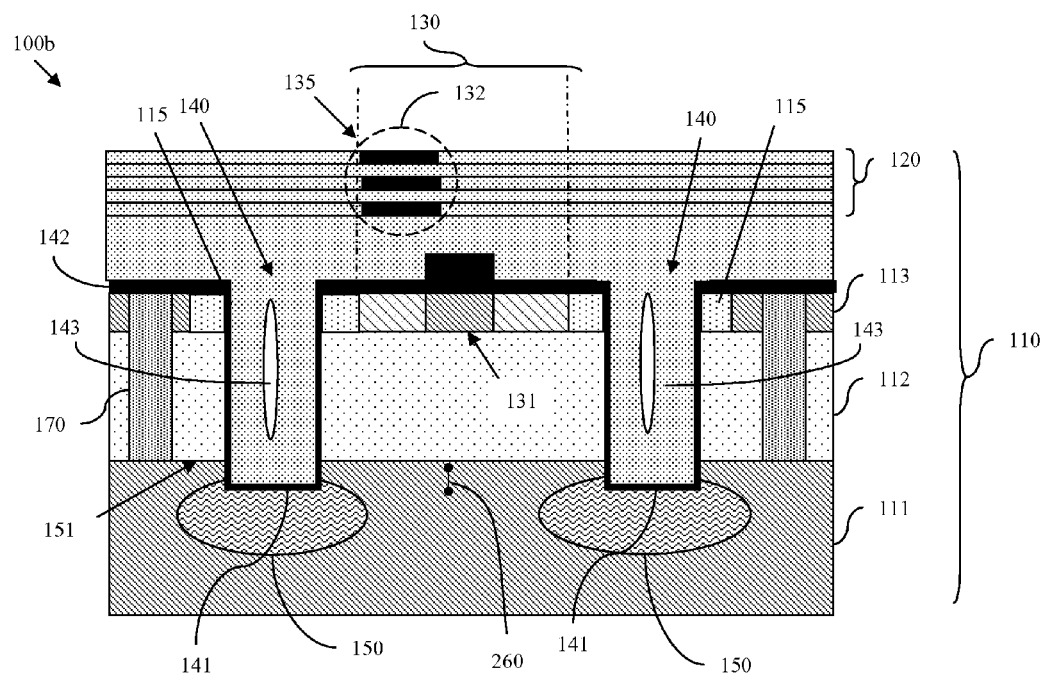
FIG. 2 is a cross-section diagram illustrating an alternative configuration for the embodiment of the semiconductor structure of FIG. 1.
Figure 7:
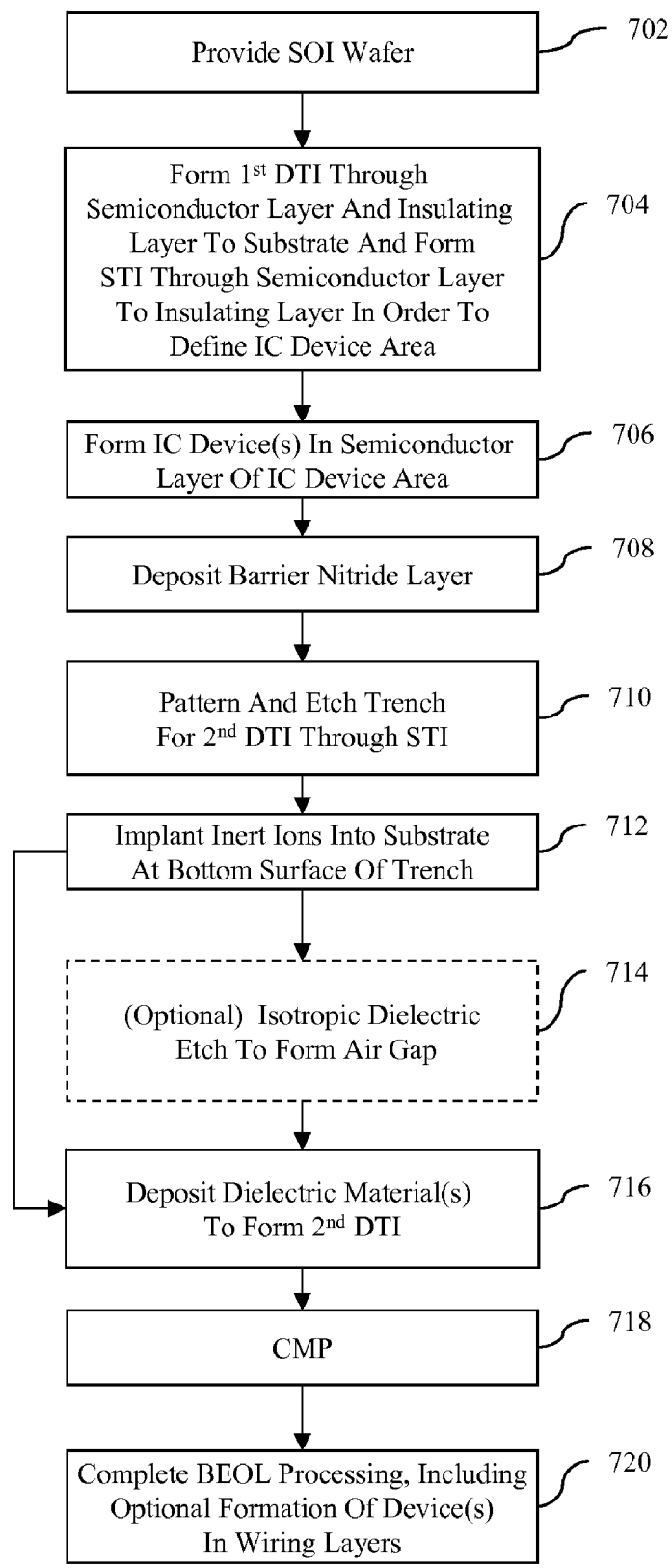
FIG. 7 is a flow diagram illustrating the method embodiments used to form the semiconductor structures of FIGS. 1-4.
Figure 8:
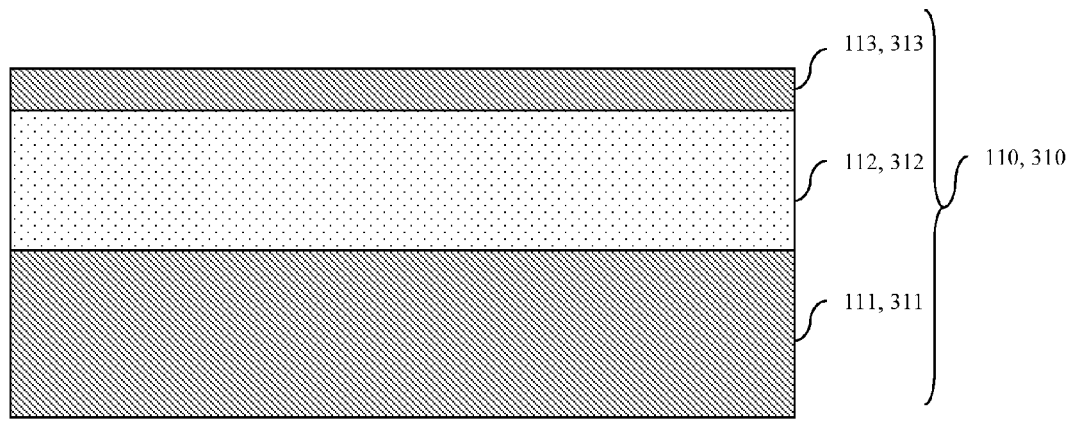
FIG. 8 is a cross-section diagram illustrating a partially completed semiconductor structure of FIGS. 1-4.

Referring to FIG. 7, also disclosed herein are method embodiments for forming the above-described semiconductor structure 100a of FIG. 1, 100b of FIG. 2, 300a of FIG. 3 and 300b of FIG. 4. Specifically, the method embodiments each comprise providing a semiconductor-on-insulator (SOI) wafer 110, 310 (702, see FIG. 8). This SOI wafer 110, 310 can comprise a semiconductor substrate 111, 311 made of a single crystalline semiconductor material (e.g., silicon or any other suitable single crystalline semiconductor material), an insulating layer 112, 312 (e.g., a buried oxide (BOX) layer) on the semiconductor substrate 111, 311 and a semiconductor layer 113, 313 (e.g., a single crystalline semiconductor layer, such as silicon or another suitable single crystalline semiconductor layer) on the insulating layer 112, 312.

Figure 9:
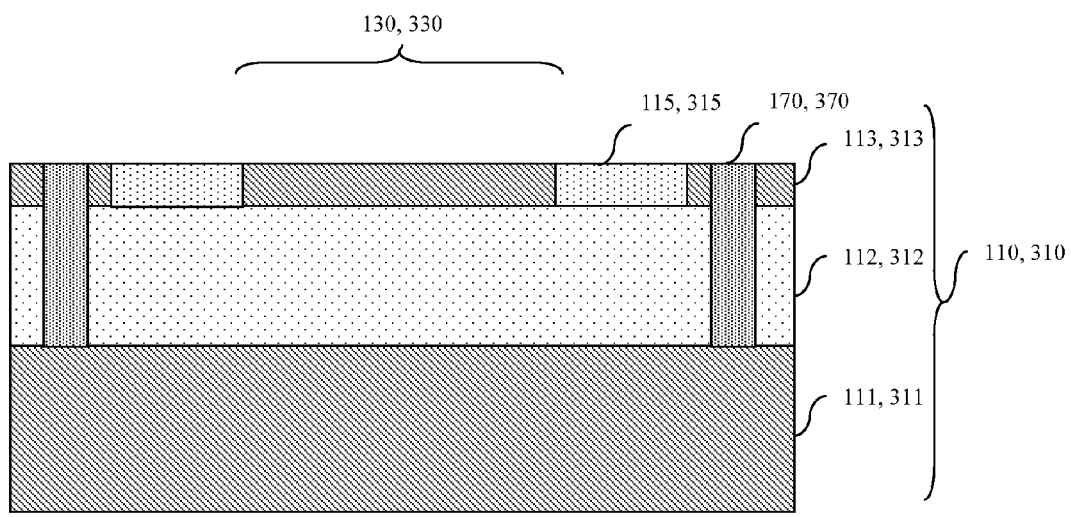
FIG. 9 is a cross-section diagram illustrating a partially completed semiconductor structure of FIGS. 1-4.

Next, the method embodiments comprise forming a shallow trench isolation (STI) region 115, 315 within the semiconductor layer 113, 313 and further forming a first deep trench isolation (DTI) region 170, 370 extending through the semiconductor layer 113, 313 and the insulator layer 112, 312 to the semiconductor substrate 111, 311 (704, see FIG. 9). The order and techniques by which such isolation regions are to be formed can vary. However, they must be formed and, more particularly, patterned such that the STI 115, 315 defines (i.e., delimits, borders, surrounds, etc.) a designated integrated circuit device area 130, 330 and further such that the DTI 170, 370 positioned laterally outside the STI 115, 315 (i.e., surrounding or bordering the STI). The STI 115, 315 and the first DTI 170, 370 must further be formed such they are separated by semiconductor material. That is, the upper sidewalls of both the STI 115, 315 and first DTI 170, 370 must be comprise semiconductor material from the semiconductor layer 113, 313. Finally, the STI 115, 315 and the first DTI 170, 370 must be formed such that the first DTI 170, 370 comprises a different material than both the insulating layer 112, 312 and the STI 115, 315. For example, the insulating layer 112, 312 and STI 115, 315 can comprise an oxide (e.g., $SiO_2$) and the first DTI 170, 370 can comprise a nitride or polysilicon material. Forming of these trench isolation regions and particularly the STI 115, 315 defines (i.e., delimits) an integrated circuit device area 130, 330 of the wafer. In the case of structures 300a and 300b, these different materials allow the portion of the insulating layer 312 within the designated integrated circuit device area 330 to subsequently be selectively etched in order to form the air gap 380 (see more detailed discussion below at process 714).

Figure 10:
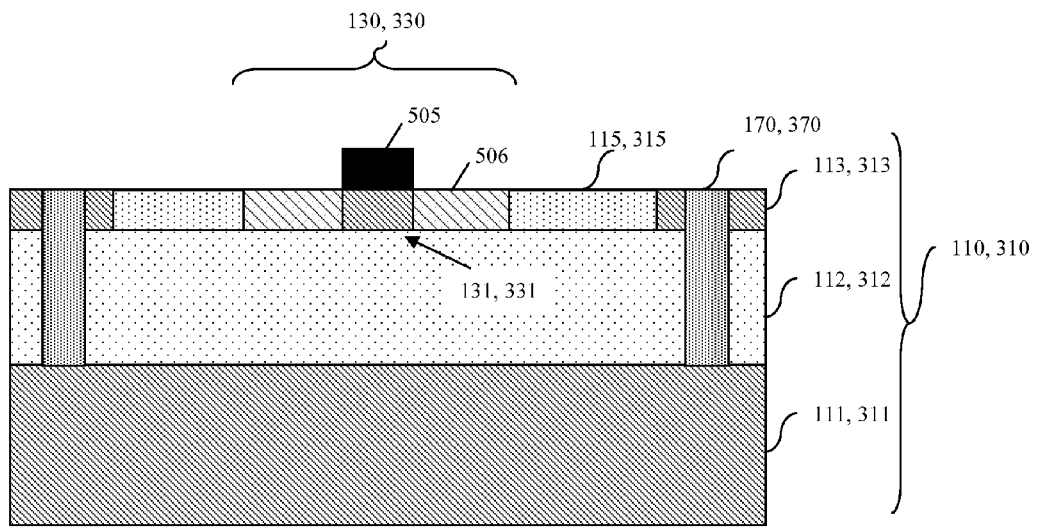
FIG. 10 is a cross-section diagram illustrating a partially completed semiconductor structure of FIGS. 1-4.

An integrated circuit device 131, 331, such as a radio frequency (RF) switch, can be formed in the semiconductor layer 113, 313. It should be noted that formation of the integrated circuit device 131, 331 can include the formation of gate structures 505 on the semiconductor layer 113, 313 and implant regions 506 within the semiconductor layer 113, 313, as necessary. It should be understood that although the integrated circuit device 131, 331 is illustrated as comprising only a single component (e.g., a single transistor), it is anticipated that each integrated circuit device 131, 331 may contain multiple components (e.g., transistors, inductors, etc.) and, additionally, that multiple integrated circuit devices 131, 331 may be formed (706, see FIG. 10).

Figure 11:
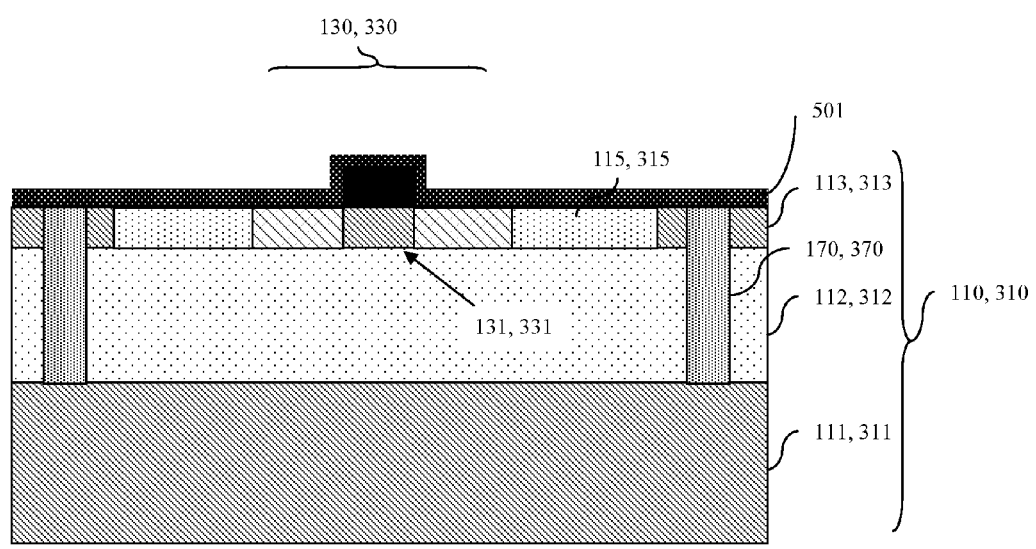
FIG. 11 is a cross-section diagram illustrating a partially completed semiconductor structure of FIGS. 1-4.

Next, a conformal barrier nitride layer 501 may be formed (e.g., deposited) on the semiconductor layer 113, 313 above the integrated circuit device 131, 331 (708, see FIG. 11).

Figure 12:
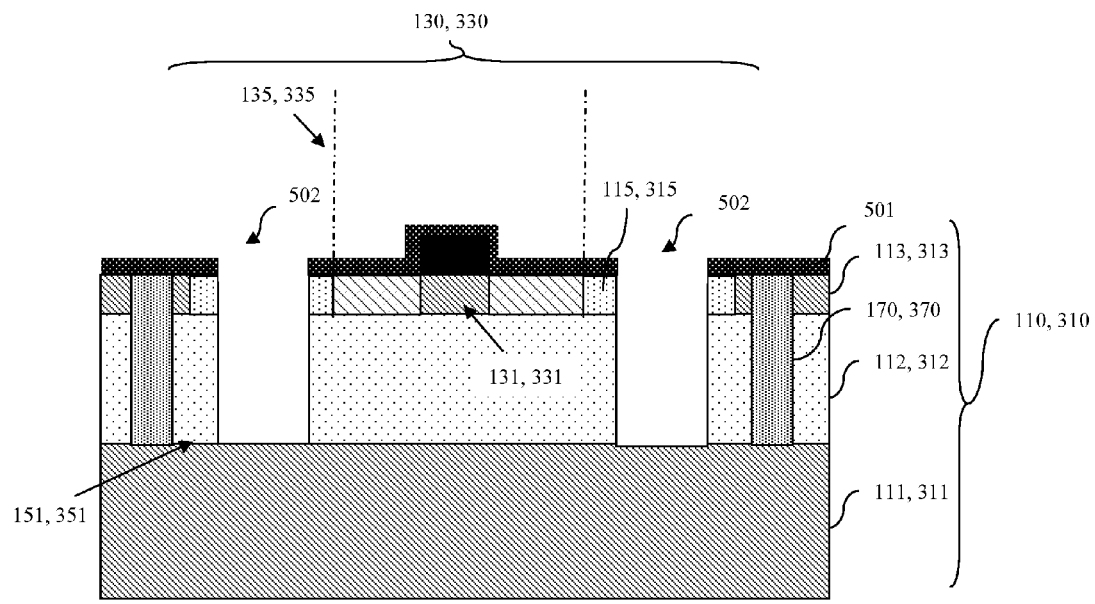
FIG. 12 is a cross-section diagram illustrating a partially completed semiconductor structure of FIGS. 1 and 3.
Figure 13:
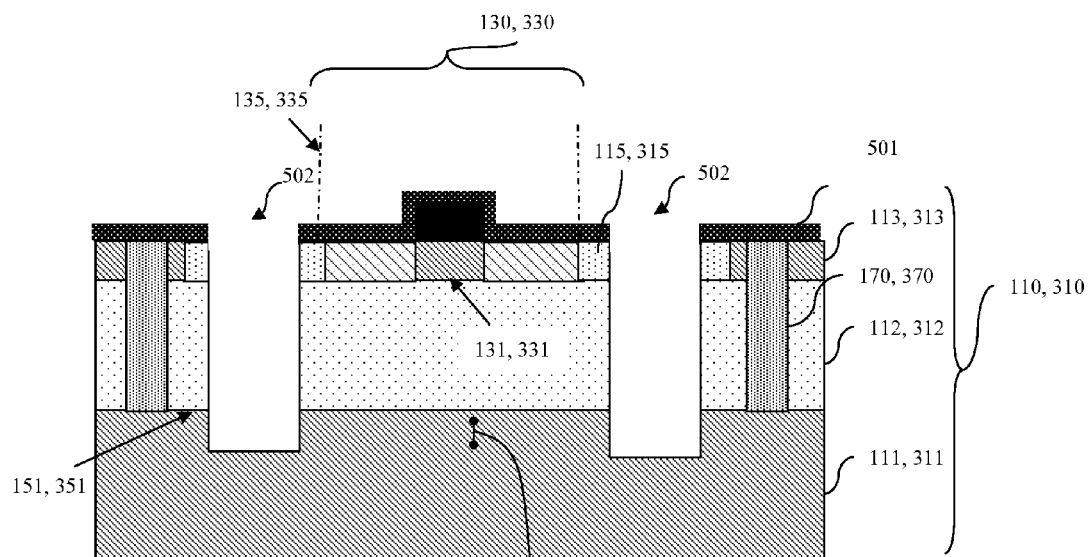
FIG. 13 is a cross-section diagram illustrating a partially completed semiconductor structure of FIGS. 2 and 4.

Once the barrier nitride layer 501 is formed, a trench 502 for a second deep trench isolation region 140, 340 is patterned and etched (e.g., using a reactive ion etch (RIE) technique) (710, see FIGS. 12 and 13). Specifically, a trench 502 is formed that extends through the barrier nitride layer 501, through the STI 115, 315 and through the insulating layer 112, 312, stopping either: (1) at the top surface 151, 351 of the semiconductor substrate 111, 311 (as illustrated in FIG. 12) or (2) a predetermined depth 260, 460 within the semiconductor substrate 111, 311 (i.e., below the top surface 151, 351 of the semiconductor substrate 111, 311) (as illustrated in FIG. 13). This trench 502 is particularly patterned such that it is positioned within the STI 115, 315 and, thereby outside lateral boundaries 135, 335 of the integrated circuit device area 130, 330 and particularly outside lateral boundaries of any integrated circuit device 131, 331 in the semiconductor layer 113, 313.

Figure 14:
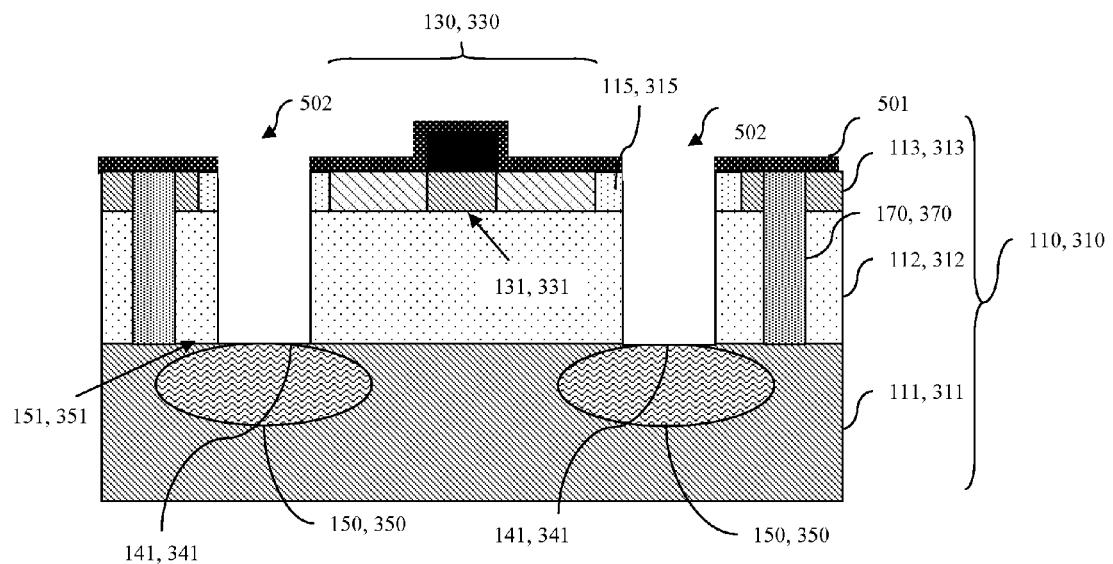
FIG. 14 is a cross-section diagram illustrating a partially completed semiconductor structure of FIGS. 1 and 3.
Figure 15:
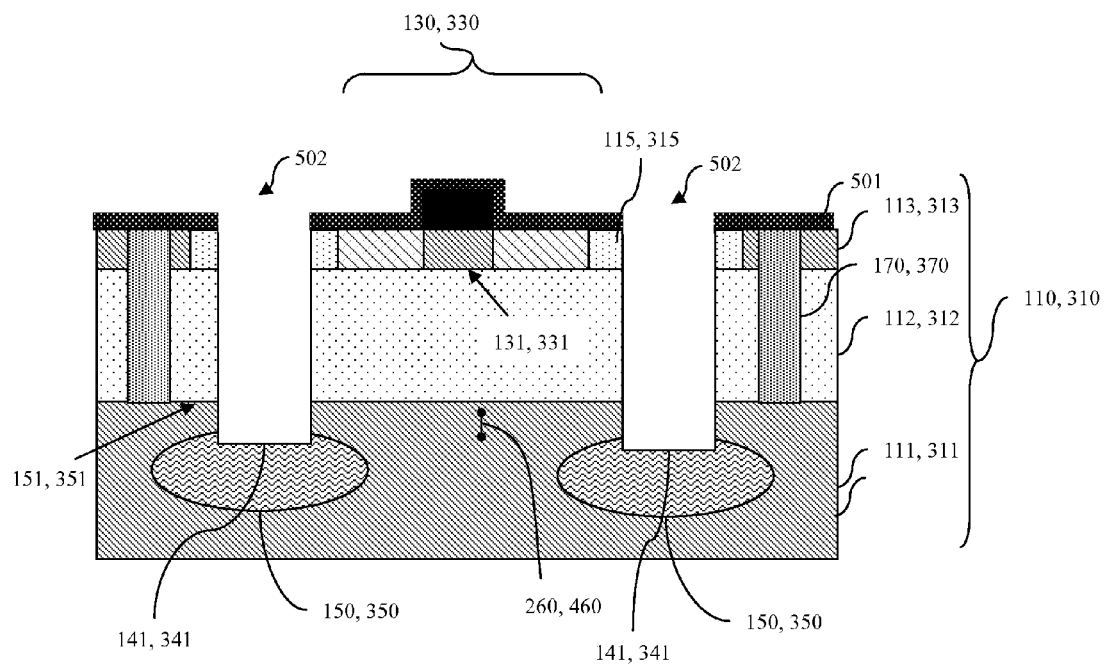
FIG. 15 is a cross-section diagram illustrating a partially completed semiconductor structure of FIGS. 2 and 4.

Once the trench 502 is etched, inert ions can be implanted into the semiconductor substrate 111, 311 so as to form an at least partially amorphized region 150, 350 of the semiconductor substrate 111, 311 adjacent to a bottom surface 141, 341 of the trench 502 (712, see FIGS. 14 and 15). Specifically, a fully or partially amorphized region 150, 350 can be formed in the single crystalline substrate material 111, 311 by performing an inert ion implant process 712. The inert ions implanted can comprise, for example, argon ions, krypton ions, nitrogen ions, xenon ions, neon ions, carbon ions, oxygen ions, etc. For example, in an exemplary process 712, argon ions can be implanted at a dose greater than $1\times10^{15}$ atoms/cm$^2$ (e.g., at approximately $5\times10^{15}$ atoms/cm$^2$) and with an implant energy of less than 100 KeV (e.g., at approximately 30 KeV). Such an implant process either fully or partially amorphizes the regions of the substrate 111, 311 adjacent to the bottom surface 141, 341 of the trench 502 and, thereby increases resistance within the substrate 111, 311 and minimize harmonics. It should be noted that if the bottom surface 141, 341 of the trench 502 is at the top surface 151, 351 of the substrate 111, 311, the at least partially amorphized region 150, 350 of the semiconductor substrate 111, 311 will be immediately adjacent to the insulating layer 112, 312 (as illustrated in FIG. 14). However, if the bottom surface 141, 341 of the trench 502 is below the top surface 151, 351 of the substrate 11, 311, the at least partially amorphized region 150, 350 of the semiconductor substrate 111, 311 is embedded within the substrate and, thereby separated from the insulating layer 112, 312 by the predetermined distance 260, 460.

Figure 16:
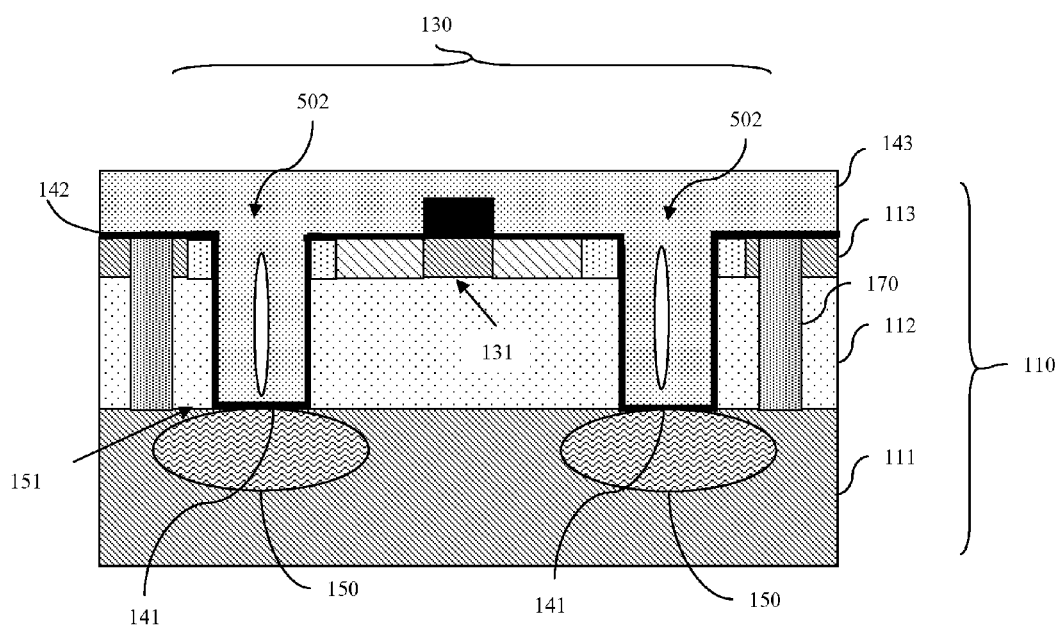
FIG. 16 is a cross-section diagram illustrating a partially completed semiconductor structure of FIG. 1.

At this point, the techniques for forming the structures 100a-b of FIGS. 1-2 and 300a-b of FIGS. 3-4 diverge. That is, in the case of the structures 100a-b, immediately after the ions are implanted at process 712, the trench 502 can optionally be lined with a first dielectric material 142 (e.g., an oxide, such as silicon dioxide (SiO$_2$), or a nitride, such as silicon nitride (SiN)) and then filled with a second dielectric material 143 so as to form the second deep trench isolation region 140 (716, e.g., as illustrated in FIG. 16 for the structure 100a of FIG. 1). Specifically, this second deep trench isolation region 140 can be filled, for example, with borophosphosilicate glass (BPSG) 143 with conventional BPSG deposition techniques (e.g., low pressure chemical vapor deposition (LPCVD) or plasma enhanced chemical vapor deposition (PECVD)). Alternatively, the second deep trench isolation region 140 can be filled with any other suitable trench isolation fill material (e.g., an oxide or nitride fill material). The deposition process 716 is followed by a chemical mechanical polishing (CMP) process (718).

Figure 17:
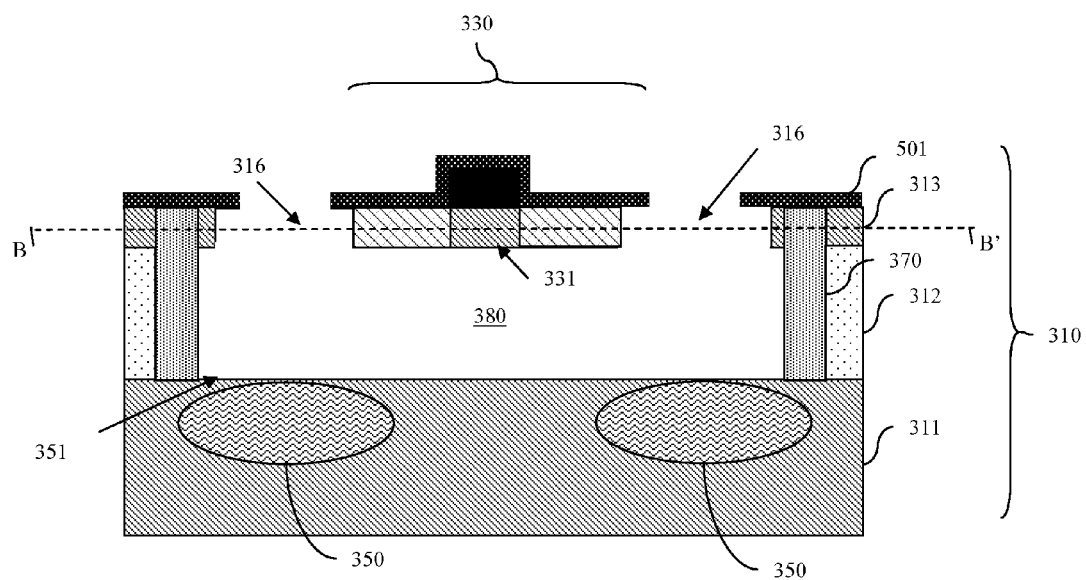
FIG. 17 is a cross-section diagram illustrating a partially completed semiconductor structure of FIG. 3.

Alternatively, in the case of the structures 300a-300b, after ions are implanted at process 712 and prior to filling the trench 502 at process 716, an isotropic etch process is performed in order to selectively remove that portion of the insulating layer 312 surrounded by the first deep trench isolation region 370 so as to create an air gap 380 between the semiconductor layer 313 and the semiconductor substrate 311 (714, e.g., as illustrated in FIG. 17 for the structure 300a of FIG. 3). This isotropic etch process 714 will further etch (i.e., remove) the STI region 315, thereby creating the opening 316 surrounding the integrated circuit area 330. For example, if the insulating layer 312 and STI region 315 are formed with an oxide material (e.g., SiO$_2$) and the first deep trench isolation region 370 is filled with a nitride or polysilicon material, then that portion of the insulating layer 312 surrounded by the first deep trench isolation region 370 can be selectively etched using a buffered hydrofluoric (HF) acid wet etch process (e.g., for 30 minutes for an approximately 50 μm oxide insulating layer 312). This etch process forms the air gap 380 such that the first deep trench isolation region 370 remains intact. This etch process will further form the opening 316 through the semiconductor layer 313 by simultaneously etching away the STI material which remains after the trench 702 was etched at process 710.

Figure 18:
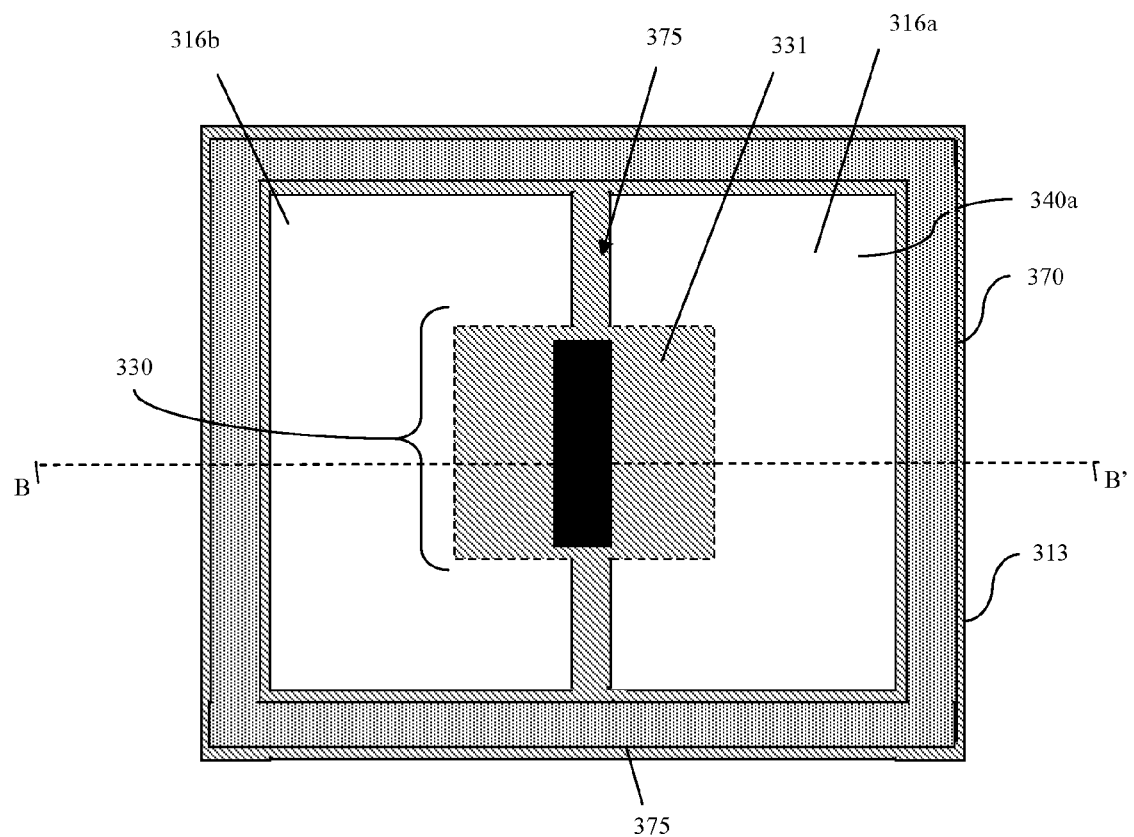
FIG. 18 is a top view diagram of the B-B' cross-section at the semiconductor layer level of FIG. 17.

FIG. 18 is a top view diagram of the cross-section B-B' through the semiconductor layer 313 level of FIG. 17. It should be noted that, in order to form the structures 300a of FIG. 3 and 300b of FIG. 4, the STI region 315 is patterned at process 704 so as to surround the lateral boundaries 335 of the designated integrated circuit area 330 and, thereby any device(s) 331, which comprise doped regions in the semiconductor layer 313 (as shown) or any device(s) 332 that will subsequently be formed in wiring layers (at process 720, discussed below). Additionally, the STI 315 is patterned so that it is segmented into two or more segments so following the isotropic etch process 714 the opening 316 that is created is also segmented (see segments 316a and 316b). This ensure that portions 375 of the semiconductor layer 313 will extend across the designated integrated circuit device area 330 and be connected to the first deep trench isolation region 370. These semiconductor layer sections 375 remain intact during air gap 380 formation at process 714 and provide mechanical stability to the resulting structure 300a, 300b. That is, they function as a bridge in order to prevent collapse of the semiconductor layer 313 into the air gap 380 on the substrate 311, when the STI 315 is etched.

Figure 19:
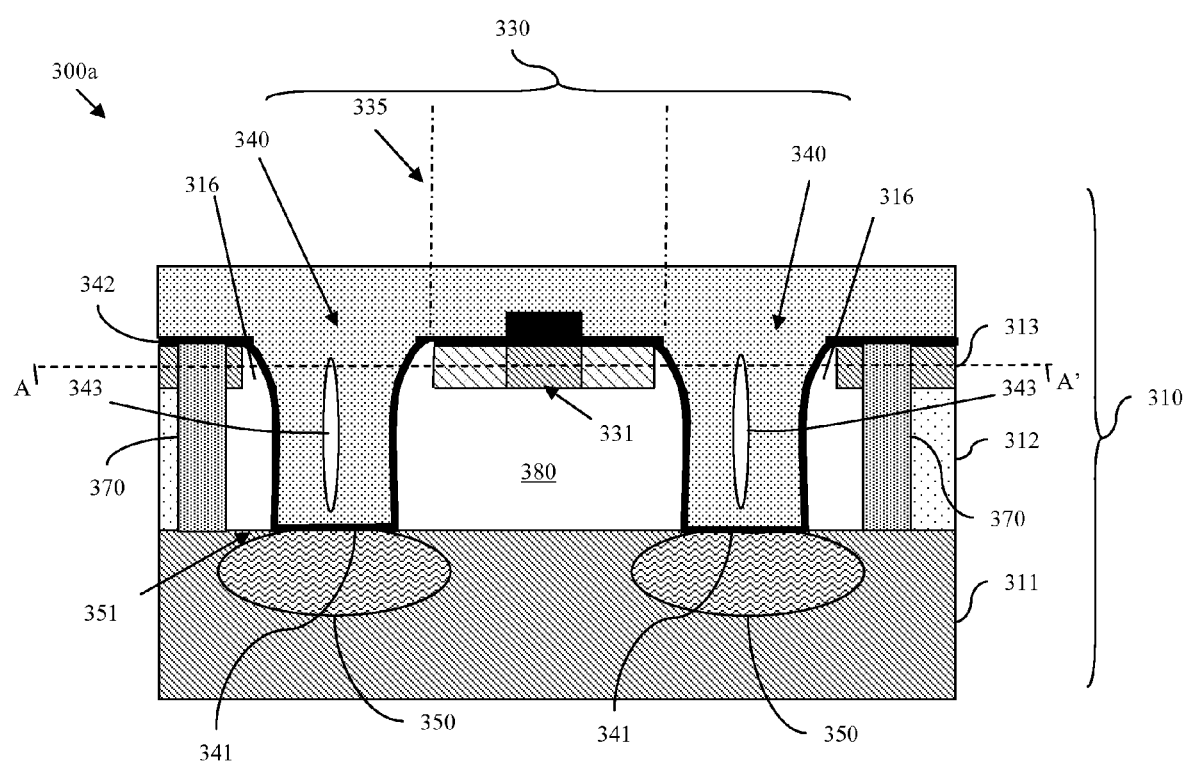
FIG. 19 is a cross-section diagram illustrating a partially completed semiconductor structure of FIG. 3.

Once the air gap 380 is formed, then a thin first dielectric liner material 142 (e.g., an oxide, such as silicon dioxide (SiO$_2$), or a nitride, such as silicon nitride (SiN)) can optionally be deposited. Next, a second dielectric material 143 can be deposited filling the portion of the air gap located below the original opening for the trench 502 so as to form the second deep trench isolation region 340 extending through the opening 316 and air gap 380 to the substrate 311 (716, e.g., as illustrated in FIG. 19 for the structure 300a of FIG. 1). Specifically, this second deep trench isolation region 340 can be filled, for example, with borophosphosilicate glass (BPSG) 143 with conventional BPSG deposition techniques (e.g., low pressure chemical vapor deposition (LPCVD) or plasma enhanced chemical vapor deposition (PECVD)). Alternatively, the second deep trench isolation region 340 can be filled with any other suitable trench isolation fill material (e.g., an oxide or nitride fill material). The deposition process 716 is followed by a chemical mechanical polishing (CMP) process (718).

Following CMP at process 718, conventional back end of the line (BEOL) processing can be performed (720). This BEOL processing can include formation of metal lines 120, 320 (i.e., wiring layers) and interlayer dielectrics above the semiconductor layer 113, 313. It can further include the formation of via contacts. Optionally, this BEOL processing 720 can optionally include the formation of one or more integrated circuit devices (e.g., see inductor 132, 332) within one or more of the wiring layers 120, 320 such that the second trench isolation region 140, 340 is positioned outside lateral boundaries 135, 335 of the at least one wiring level integrated circuit device 132, 332.

The resulting integrated circuit chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

Therefore, disclosed above are embodiments of a semiconductor structure, a design structure for the semiconductor structure and a method of forming the semiconductor structure. The embodiments reduce harmonics and improve isolation between the active semiconductor layer and the substrate of a semiconductor-on-insulator (SOI) wafer. Specifically, the embodiments incorporate a trench isolation region extending to a fully or partially amorphized region of the SOI wafer substrate located either at the top surface of the substrate or embedded within the substrate. The deep trench isolation region is positioned outside lateral boundaries of at least one integrated circuit device located at or above the active semiconductor layer of the SOI wafer and, thereby improves isolation. The fully or partially amorphized region of the substrate reduces substrate mobility, which reduces the charge layer at the substrate/BOX interface and, thereby reduces harmonics. Optionally, the embodiments can further incorporate an air gap between the wafer substrate and integrated circuit device(s) in order to further improve isolation.

What is claimed is:

1. A method of forming a semiconductor structure, said method comprising:
   providing a wafer comprising:
      a semiconductor substrate comprising a single crystalline semiconductor material;
      an insulating layer on said semiconductor substrate; and
      a semiconductor layer on said insulating layer;
   forming a shallow trench isolation region within said semiconductor layer and a first deep trench isolation region extending through said semiconductor layer and said insulator layer to said semiconductor substrate such that said shallow trench isolation region and said first deep trench isolation region are separated by semiconductor material and such that said first deep trench isolation region comprises a different material than said insulating layer and said shallow trench isolation region, said forming defining an integrated circuit device area of said wafer;
   etching a trench extending through said shallow trench isolation region and said insulating layer and stopping one of at a top surface of said semiconductor substrate and a predetermined depth within said semiconductor substrate;
   implanting inert ions into said semiconductor substrate so as to form an at least partially amorphized region of said semiconductor substrate adjacent to a bottom surface of said trench;
   performing an isotropic etch process to selectively remove a portion of said insulating layer and said shallow trench isolation region within said integrated circuit device area of said wafer so as to create an air gap between said semiconductor layer and said semiconductor substrate and an opening within said semiconductor layer extending to said air gap; and
   depositing a dielectric material through said opening and into said air gap so as to form a second deep trench isolation region.

2. The method according to claim 1, said shallow trench isolation region being patterned such that after said performing of said isotropic etch at least one section of said semiconductor layer within said integrated circuit device area of said wafer remains intact extending to said first deep trench isolation region for mechanical stability.

3. The method according to claim 1, said implanting comprising implanting at least one of argon ions, krypton ions, nitrogen ions, xenon ions, neon ions, carbon ions, and oxygen ions.

4. The method according to claim 1, further comprising, before said etching of said trench, forming at least one integrated circuit device in said semiconductor layer within said integrated circuit device area of said wafer.

5. The method according to claim 1, further comprising, after said filling of said trench to form said second deep trench isolation region, forming at least one wiring layer above said semiconductor layer within said integrated circuit device area of said wafer and forming at least one integrated circuit device in said at least one wiring layer such that said second deep trench isolation region is positioned outside lateral boundaries of said at least one integrated circuit device.

6. The method according to claim 1, said filling of said trench comprising performing a chemical vapor deposition process to fill said trench with borophosphosilicate glass (BPSG).

7. The method according to claim 6, said filling of said trench comprising, before said performing of said chemical vapor deposition process, lining said trench with one of an oxide and a nitride.

* * * * *